(12) United States Patent
Ota et al.

(10) Patent No.: US 11,424,774 B2
(45) Date of Patent: Aug. 23, 2022

(54) WIRELESS COMMUNICATION APPARATUS AND COEFFICIENT UPDATING METHOD

(71) Applicant: FUJITSU LIMITED, Kawasaki (JP)

(72) Inventors: Tomoya Ota, Kawasaki (JP); Hiroyoshi Ishikawa, Kawasaki (JP); Alexander Nikolaevich Lozhkin, Kawasaki (JP); Toru Maniwa, Setagaya (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 17/197,295

(22) Filed: Mar. 10, 2021

(65) Prior Publication Data
US 2021/0288682 A1    Sep. 16, 2021

(30) Foreign Application Priority Data
Mar. 11, 2020 (JP) .............................. JP2020-042067

(51) Int. Cl.
*H04B 1/04* (2006.01)
*H03F 3/24* (2006.01)
(Continued)

(52) U.S. Cl.
CPC ......... *H04B 1/0475* (2013.01); *H03F 1/3247* (2013.01); *H03F 3/24* (2013.01);
(Continued)

(58) Field of Classification Search
CPC .......... H04B 1/0475; H04B 2001/0425; H04B 2001/0433; H03F 1/3241; H03F 1/3247; H03F 3/24
See application file for complete search history.

(56) References Cited

U.S. PATENT DOCUMENTS 6,288,610 B1    9/2001  Miyashita
9,680,511 B1 *  6/2017  Hamano .............. H04B 1/0475
(Continued)

FOREIGN PATENT DOCUMENTS

JP    11-154880    6/1999
JP    2005-217714  8/2005
(Continued)

OTHER PUBLICATIONS

Y.Zhang et al., "In-phase or quadrature observation for indirect learning architecture digital predistortion method based on forward modeling", APMC2018, pp. 938-940, Nov. 2018.
(Continued)

*Primary Examiner* — Tuan Pham
(74) *Attorney, Agent, or Firm* — Fujitsu Patent Center

(57) ABSTRACT

A wireless communication apparatus includes: a processor that performs distortion compensation on a complex number transmission signal by using a distortion compensation coefficient; a power amplifier that amplifies the transmission signal subjected to distortion compensation by the processor; and a feedback path that feeds back a signal output from the power amplifier to supply a real number feedback signal to the processor. The processor executes a process including: estimating a complex number feedback signal by performing linear computation on the complex number transmission signal and the real number feedback signal; and updating the distortion compensation coefficient by using the estimated complex number feedback signal.

9 Claims, 10 Drawing Sheets

(51) Int. Cl.
*H03F 1/32* (2006.01)
*H04L 27/36* (2006.01)

(52) U.S. Cl.
CPC .... *H04L 27/368* (2013.01); *H03F 2201/3233* (2013.01); *H04B 2001/0425* (2013.01)

(56) References Cited

U.S. PATENT DOCUMENTS

| | | | |
|---|---|---|---|
| 2002/0065048 A1 | 5/2002 | Nagatani et al. | |
| 2005/0180527 A1 | 8/2005 | Suzuki et al. | |
| 2005/0243946 A1* | 11/2005 | Chung | H03F 1/3247 375/297 |
| 2014/0145788 A1* | 5/2014 | Matsubara | H03F 3/189 330/149 |

FOREIGN PATENT DOCUMENTS

| | | |
|---|---|---|
| JP | 2008-028746 | 2/2008 |
| JP | 2008-099166 | 4/2008 |
| JP | 2015-050687 | 3/2015 |
| WO | 2001/008320 | 2/2001 |

OTHER PUBLICATIONS

S. Habu et al., "Spectrum-Folding Scalar-Feedback Architecture for Wideband DPD with Simple Feedback Circuit", EuMC2017, pp. 1054-1057, Oct. 2017.

S. Habu et al., "SF-SFB DPD for Compensating Nonlinearity with Memory Effects in Wideband Transmitter", IEICE Technical Report, RCS2018-291 pp. 55-60, (Mar. 2019).

\* cited by examiner

WIRELESS COMMUNICATION APPARATUS AND COEFFICIENT UPDATING METHOD

CROSS-REFERENCE TO RELATED APPLICATION

This application is based upon and claims the benefit of priority of the prior Japanese Patent Application No. 2020-042067, filed on Mar. 11, 2020, the entire contents of which are incorporated herein by reference.

FIELD

The embodiments discussed herein are related to a wireless communication apparatus and a coefficient updating method.

BACKGROUND

In general, in wireless communication apparatuses, such as base station devices and the like, power amplifiers that amplify power of transmission signals are provided. The power amplifiers are generally operated in the vicinity of a saturation area in order to enhance power efficiency. However, when the power amplifiers are operated in the vicinity of the saturation area, nonlinear distortion that is generated when the transmission signals are amplified by the power amplifiers is increased. Thus, in order to suppress nonlinear distortion and meet the standards for the adjacent channel leakage ratio (ACLR), the spectrum emission mask (SEM) and the like, the wireless communication apparatuses sometimes perform distortion compensation that compensates the nonlinear distortion.

There is a predistortion technique as one of the distortion compensation techniques. In distortion compensation in the predistortion technique, a distortion compensation coefficient having an inverse characteristic of nonlinear distortion generated in a power amplifier is previously multiplied by the transmission signal that is not yet input to the power amplifier. Consequently, linearity of an output of the power amplifier is enhanced and nonlinear distortion at the time of output of the power amplifier is suppressed. As the predistortion technique, a look-up table (LUT) type predistortion technique and a series type predistortion technique are known. In the wireless communication apparatuses that use such predistortion techniques, in order to calculate or adaptively update distortion compensation coefficients, a feedback path that feeds back an output signal of the power amplifier is provided.

In general, amplitude distortion (AM/AM) and phase distortion (AM/PM) are included in the nonlinear distortion generated in the power amplifier. In order to compensate both distortion, a feedback signal (a complex number feedback signal) represented by a complex number is used and a distortion compensation process is performed. Namely, in phase component and quadrature component of the complex number feedback signal are fed back by the feedback path and are used to update the distortion compensation coefficients. Furthermore, a baseband transmission signal and a distortion compensation coefficient are also represented by a complex number and, also, a predistortion signal obtained by multiplying the distortion compensation coefficient by the transmission signal is represented by a complex number in baseband.

Patent Document 1: Japanese Laid-open Patent Publication No. 2015-050687

Patent Document 2: Japanese Laid-open Patent Publication No. 2008-028746

Patent Document 3: Japanese Laid-open Patent Publication No. 2005-217714

Patent Document 4: Japanese Laid-open Patent Publication No. 11-154880

Patent Document 5: International Publication Pamphlet No. WO 2001/008320

Non-Patent Document 1: Suguru Habu et al., "SF-SFB DPD for Compensating Nonlinearity with Memory Effects in Wideband Transmitter", Institute of Electronics, Information and Communication Engineers (IEICE) Technical Report, RCS2018-291, March, 2019

Non-Patent Document 2: S. Habu et al., "Spectrum-Folding Scalar-Feedback Architecture for Wideband DPD with Simple Feedback Circuit", EuMC 2017, pp. 1054-1057, October, 2017

Non-Patent Document 3: Y. Zhang et al., "In-phase or quadrature observation for indirect learning architecture digital predistortion method based on forward modeling", APMC 2018, pp. 938-940, November, 2018

In a feedback path through which the feedback signal represented by the complex number is fed back, two analog to digital (AD) converters, i.e., an AD converter that performs AD conversion on the in phase component of the feedback signal and an AD converter that performs AD conversion on the quadrature component, are provided. Consequently, power consumed by the AD converters is increased. Thus, studies have been conducted on a technology that feeds back the in phase component or the quadrature component of the feedback signal as real number feedback signal and updates the distortion compensation coefficient by using the real number feedback signal. When a configuration in which the feedback path feeds back the real number feedback signal is used, only a single AD converter is needed to be provided in the feedback path and it is thus possible to suppress an increase in power consumption in an analog part of the wireless communication apparatus.

However, when the distortion compensation coefficient is updated by using the real number feedback signal, there is a problem in that an amount of computation is increased and power consumption in a digital part in the wireless communication apparatus is increased. Namely, when the real number feedback signal is fed back, a model of a power amplifier is estimated based on the transmission signal represented by the complex number and based on the real number feedback signal, and then, the distortion compensation coefficient is obtained from the estimated model. At this time, the processing amount related to estimating the model of the power amplifier is large and an amount of computation is increased. As a result, power consumption in the digital part is increased, and thus, power consumption of the device is not sufficiently reduced even if the number of AD converters is reduced.

SUMMARY

According to an aspect of an embodiment, a wireless communication apparatus includes: a processor that performs distortion compensation on a complex number transmission signal by using a distortion compensation coefficient; a power amplifier that amplifies the transmission signal subjected to distortion compensation by the processor; and a feedback path that feeds back a signal output from the power amplifier to supply a real number feedback signal to the processor. The processor executes a process including:

estimating a complex number feedback signal by performing linear computation on the complex number transmission signal and the real number feedback signal; and updating the distortion compensation coefficient by using the estimated complex number feedback signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. Furthermore, the present invention is not limited to the embodiments.

[a] First Embodiment

Figure 1:
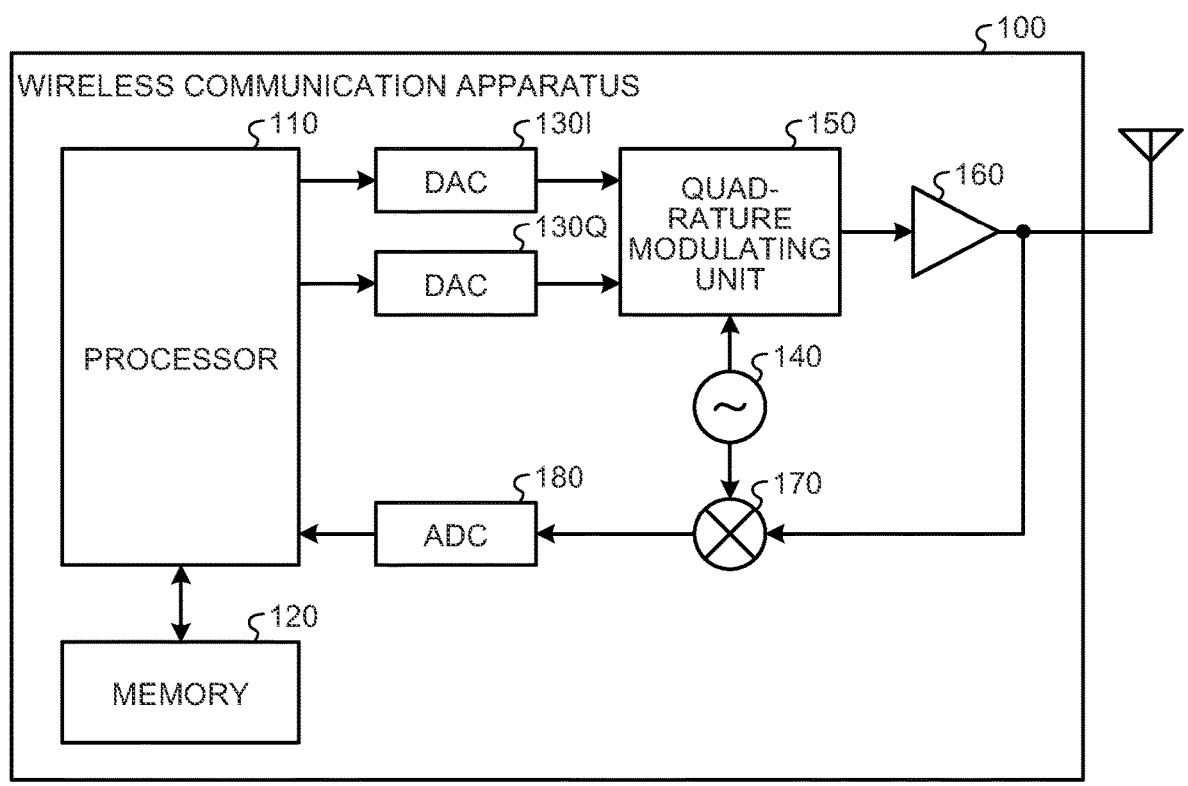
FIG. 1 is a block diagram illustrating a configuration of a wireless communication apparatus according to a first embodiment.

FIG. 1 is a block diagram illustrating a configuration of a wireless communication apparatus 100 according to a first embodiment. The wireless communication apparatus 100 illustrated in FIG. 1 includes a processor 110, a memory 120, digital-to-analog (DA) converters (hereinafter, simply referred to as a "DAC") 130I and 130Q, an oscillator 140, a quadrature modulating unit 150, a power amplifier 160, a down converter 170, and an AD converter (hereinafter, simply referred to as an "ADC") 180.

The processor 110 includes, for example, a central processing unit (CPU), a field programmable gate array (FPGA) or a digital signal processor (DSP), and performs overall control of the wireless communication apparatus 100. The processor 110 generates a transmission signal by encoding and modulating transmission data and performs a distortion compensation process on the transmission signal. Furthermore, the processor 110 updates a distortion compensation coefficient used for the distortion compensation process by using a feedback signal represented by the real number (hereinafter, referred to as a "real number FB signal") that is fed back after the transmission signal is amplified by the power amplifier 160. At this time, the processor 110 estimates a feedback signal represented by a complex number by performing linear computation on the real number FB signal and a transmission signal represented by a complex number and updates the distortion compensation coefficient from the estimated feedback signal represented by the complex numbers and the transmission signal represented by the complex number. The configuration of the processor 110 will be described in detail later.

The memory 120 includes, for example, a random access memory (RAM), a read only memory (ROM), or the like and stores information that is used for the processor 110 to perform a process.

The DAC 130I performs DA conversion on the real part of a predistortion signal that is obtained by the processor 110 performing the distortion compensation process on the transmission signal. Namely, in the processor 110, because a predistortion signal represented by a complex number is generated by multiplying a distortion compensation coefficient represented by a complex number by the transmission signal represented by the complex number, the real part of the predistortion signal (hereinafter, referred to as a "PD signal real part") and the imaginary part of the predistortion signal (hereinafter, referred to as a "PD signal imaginary part") are output from the processor 110. The DAC 130I performs DA conversion on the PD signal real part output from the processor 110.

The DAC 130Q performs DA conversion on the imaginary part of the predistortion signal that is obtained by the processor 110 performing the distortion compensation process on the transmission signal. Namely, the DAC 130Q performs DA conversion on the PD signal imaginary part output from the processor 110.

The oscillator 140 generates a local signal having frequencies for up-conversion of a transmission signal and down-conversion of a reception signal. Then, the oscillator 140 supplies the local signal to the quadrature modulating unit 150 and the down converter 170.

The quadrature modulating unit 150 uses the local signal supplied from the oscillator 140, performs quadrature modulation on the PD signal real part and the PD signal imaginary part, and generates a transmission signal having a radio frequency. Then, the quadrature modulating unit 150 outputs the transmission signal to the power amplifier 160.

The power amplifier 160 amplifies the transmission signal. The transmission signal amplified by the power amplifier 160 is transmitted via an antenna. When the power amplifier 160 amplifies the transmission signal, nonlinear distortion is generated in accordance with signal power; however, because the distortion compensation process has been performed on the transmission signal in the processor 110, the nonlinear distortion generated in the power amplifier 160 is canceled out. As a result, nonlinear distortion of the transmission signal is reduced and it is thus possible to suppress emission of adjacent bands.

The down converter 170 uses the local signal supplied from the oscillator 140 and performs down-conversion on the feedback signal that is the signal of the amplified transmission signal fed back from the power amplifier 160. At this time, the down converter 170 obtains the real number FB signal by performing down-conversion on one of the in phase component and the quadrature component of the feedback signal. The down converter 170 outputs the real number FB signal to the ADC 180.

The ADC 180 performs AD conversion on the real number FB signal and outputs the obtained digital real number FB signal to the processor 110.

Figure 2:
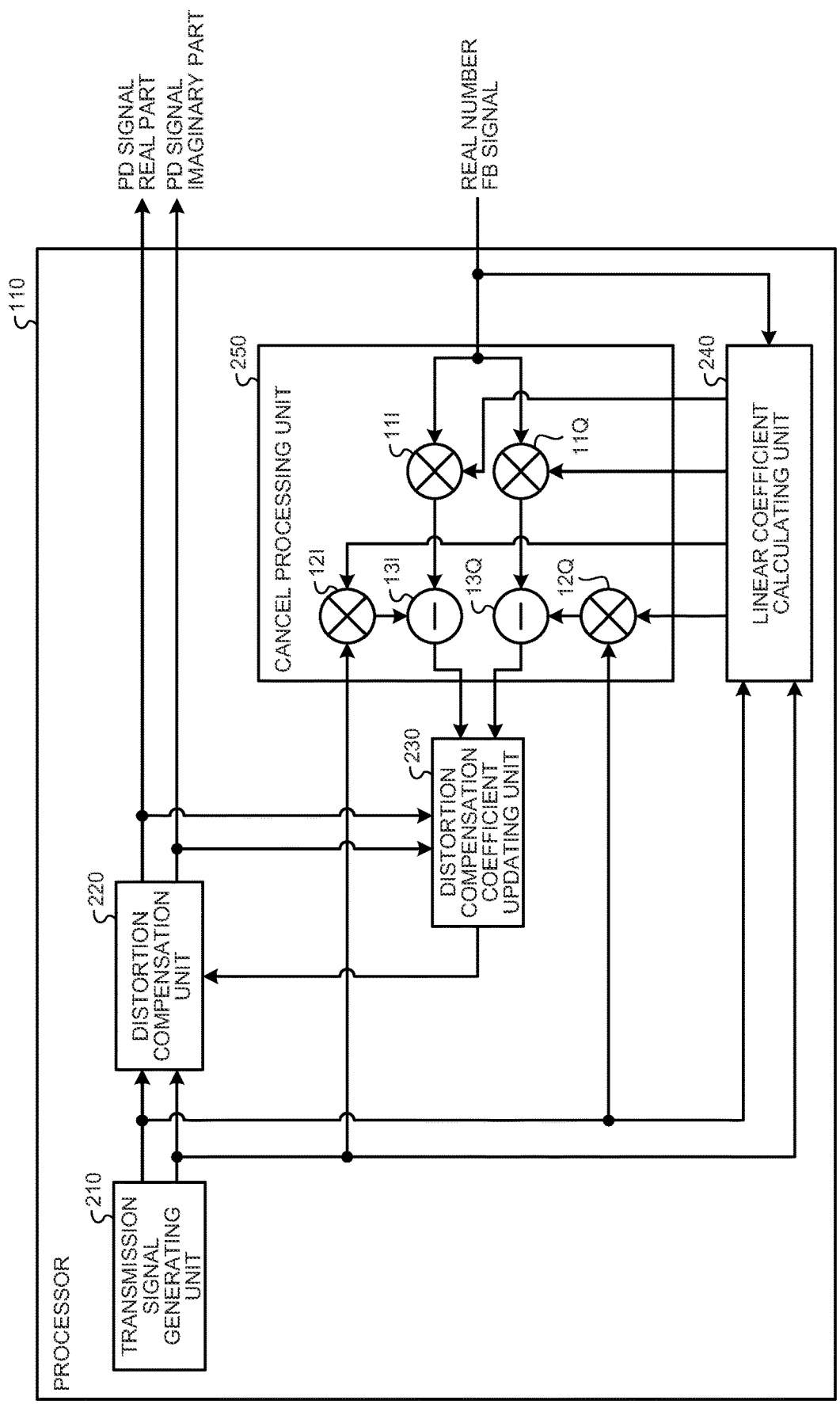
FIG. 2 is a block diagram illustrating a configuration of a processor according to the first embodiment.

FIG. 2 is a block diagram illustrating a configuration of the processor 110. The processor 110 according to the first embodiment includes a transmission signal generating unit 210, a distortion compensation unit 220, a distortion compensation coefficient updating unit 230, a linear coefficient calculating unit 240, and a cancel processing unit 250.

The transmission signal generating unit 210 encodes and modulates the transmission data and generates a transmission signal represented by a complex number. Namely, the transmission signal generating unit 210 generates a transmission signal having an in phase component and a quadrature component, outputs, for example, the in phase component as the real part of the transmission signal, and outputs the quadrature component as the imaginary part of the transmission signal.

The distortion compensation unit 220 performs the distortion compensation process on the transmission signal. Specifically, the distortion compensation unit 220 includes a look-up table (LUT) that stores therein distortion compensation coefficients in association with, for example, power of the transmission signals and reads, when a transmission signal is input, the distortion compensation coefficient associated with the power of the input transmission signal from the LUT. Then, the distortion compensation unit 220 generates, by multiplying the read distortion compensation coefficient by the transmission signal, a predistortion signal that has been subjected to distortion compensation. Both of the transmission signal and the distortion compensation coefficient are represented by complex numbers and the predistortion signal is also represented by a complex number. Consequently, the distortion compensation unit 220 outputs the real part of the predistortion signal (PD signal real part) and the imaginary part of the predistortion signal (PD signal imaginary part).

The LUT included in the distortion compensation unit 220 is periodically updated by the distortion compensation coefficient updating unit 230. Namely, the LUT included in the distortion compensation unit 220 is periodically replaced by the LUT included in the distortion compensation coefficient updating unit 230.

Similarly to the distortion compensation unit 220, the distortion compensation coefficient updating unit 230 includes an LUT that stores therein distortion compensation coefficients in association with, for example, power of the transmission signals. Then, the distortion compensation coefficient updating unit 230 updates the distortion compensation coefficients stored in the LUT based on the complex number predistortion signals that include the PD signal real parts and the PD signal imaginary parts and based on the complex number feedback signals estimated by the cancel processing unit 250. Specifically, the distortion compensation coefficient updating unit 230 performs the distortion compensation process on the complex number feedback signals based on its own LUT and updates the distortion compensation coefficients stored in the LUT such that an error between each of the predistortion signals and the feedback signals that have been subjected to distortion compensation. The distortion compensation coefficient updating unit 230 periodically outputs a copy of its own LUT to the distortion compensation unit 220 and replaces the LUT by the LUT included in the distortion compensation unit 220.

The linear coefficient calculating unit 240 calculates, based on the real part and the imaginary part of the transmission signal and based on the real number FB signal, linear coefficients for estimating a complex number feedback signal from the real number FB signal. Namely, the linear coefficient calculating unit 240 calculates the linear coefficients for estimating the real part and the imaginary part of the complex number feedback signal by performing linear computation on three real numbers of the real number FB signal and the real part and the imaginary part of the transmission signal. The linear coefficients to be calculated are real numbers. Furthermore, a specific calculation method of the linear coefficients will be described in detail later.

The cancel processing unit 250 estimates the complex number feedback signal from the real number FB signal by performing linear computation that performs addition and subtraction on the terms in each of which the linear coefficient is multiplied by the corresponding items of the real part and the imaginary part of the transmission signal and the real number FB signal. Then, the cancel processing unit 250 outputs the real part and the imaginary part of the estimated complex number feedback signal to the distortion compensation coefficient updating unit 230.

Here, the linear coefficients calculated by the linear coefficient calculating unit 240 and linear computation performed by the cancel processing unit 250 will be specifically described.

When a nonlinear model of the power amplifier 160 is, for example, a fifth-order memoryless polynomial, a complex number feedback signal $y_I(n)+jy_Q(n)$ at time n is represented by Equation (1) below.

$$y_I(n)+jy_Q(n)=a_1 x(n)+a_3|x(n)|^2 x(n)+a_5|x(n)|^4 x(n) \quad (1)$$

In Equation (1) above, j denotes a unit of imaginary numbers; x(n) denotes a complex number transmission signal at time n; and a1, a3, and a5 denote coefficients in the nonlinear model of the power amplifier 160. Here, if $x(n)=x_I(n)+jx_Q(n)$, $a_1=a_{1,I}+ja_{1,Q}$, $a_3=a_{3,I}+ja_{3,Q}$, and $a_5=a_{5,I}+ja_{5,Q}$, Equation (1) above can be transformed to Equation (2) below.

$$\begin{aligned} y_I(n) + jy_Q(n) = & \quad (2) \\ (a_{1,I} + ja_{1,Q})\{x_I(n) + jx_Q(n)\} + (a_{3,I} + ja_{3,Q})|x(n)|^2\{x_I(n) + jx_Q(n)\} + \\ (a_{5,I} + ja_{5,Q})|x(n)|^4\{x_I(n) + jx_Q(n)\} = \{a_{1,I}x_I(n) - a_{1,Q}x_Q(n)\} + \\ j\{a_{1,I}x_Q(n) + a_{1,Q}x_I(n)\} + \{a_{3,I}|x(n)|^2 x_I(n) - a_{3,Q}|x(n)|^2 x_Q(n)\} + \\ j\{a_{3,I}|x(n)|^2 x_Q(n) + a_{3,Q}|x(n)|^2 x_I(n)\} + \\ \{a_{5,I}|x(n)|^4 x_I(n) - a_{5,Q}|x(n)|^4 x_Q(n)\} + \\ j\{a_{5,I}|x(n)|^4 x_Q(n) + a_{5,Q}|x(n)|^4 x_I(n)\} \end{aligned}$$

Therefore, the real part $y_I(n)$ and the imaginary part $y_Q(n)$ of the complex number feedback signal are expressed by Equations (3) and (4), respectively.

$$y_I(n)=\{a_{1,I}x_I(n)-a_{1,Q}x_Q(n)\}+\{a_{3,I}|x(n)|^2 x_I(n)-a_{3,Q}|x(n)|^2 x_Q(n)\}+\{a_{5,I}|x(n)|^4 x_I(n)-a_{5,Q}|x(n)|^4 x_Q(n)\} \quad (3)$$

$$y_Q(n)=\{a_{1,I}x_Q(n)-a_{1,Q}x_I(n)\}+\{a_{3,I}|x(n)|^2 x_Q(n)-a_{3,Q}|x(n)|^2 x_I(n)\}+\{a_{5,I}|x(n)|^4 x_Q(n)-a_{5,Q}|x(n)|^4 x_I(n)\} \quad (4)$$

In Equations (3) and (4), three terms each enclosed in curly brackets are included, the first term represents the linear component, the second term and the third term represent the nonlinear component. Furthermore, in each of the terms in Equations (3) and (4), the transmission signal and the real part component and the imaginary part component of the coefficients of the nonlinear model are present in a mixed manner. Because the real number FB signal corresponds to the real part or the imaginary part of the complex number feedback signal, the real number FB signal can be represented by Equation below from Equations (3) and (4).

(real number $FB$ signal)=(real part of linear component)+(imaginary part of linear component)+(real part of nonlinear component)+(imaginary part of nonlinear component)

After convergence of the distortion compensation coefficients, because the nonlinear component at the time of output from the power amplifier 160 approaches zero, the real number FB signal indicated by, for example, Equation (3) above can be approximated to Equation (5) below.

$$y(n) \cong h_I x_I(n) - h_Q x_Q(n) \qquad (5)$$

However, Equation (5) above is rewritten as $y_I(n)=y(n)$, $a_{1,I}=h_I$, and $a_{1,Q}=h_Q$. Furthermore, it is assumed that $h_I$ and $h_Q$ are real numbers that are not zero.

Incidentally, the cancel processing unit 250 estimates a complex number feedback signal, the real part $y_I(n)$ and the imaginary part $Y_Q(n)$ of the feedback signal $Y(n)=Y_I(n)+jY_Q(n)$ to be estimated are expressed by Equations (6) and (7) below, respectively.

$$Y_I(n) = \alpha_I y(n) - \beta_I x_Q(n) \qquad (6)$$

$$Y_Q(n) = \alpha_Q y(n) - \beta_Q x_I(n) \qquad (7)$$

In Equations (6) and (7), $\alpha_I$, $\alpha_Q$, $\beta_I$, and $\beta_Q$ denote linear coefficients for estimating a complex number feedback signal based on linear computation performed by using the real number FB signal $y(n)$. When Equation (5) is substituted in Equations (6) and (7), Equations (8) and (9) below are obtained.

$$Y_I(n) \cong \alpha_I \{h_I x_I(n) - h_Q x_Q(n)\} - \beta_I x_Q(n) = \qquad (8)$$
$$\alpha_I h_I x_I(n) - (\alpha_I h_Q + \beta_I) x_Q(n)$$

$$Y_Q(n) \cong \alpha_Q \{h_I x_I(n) - h_Q x_Q(n)\} - \beta_Q x_I(n) = \qquad (9)$$
$$(\alpha_Q h_I - \beta_Q) x_I(n) - \alpha_Q h_Q x_Q(n)$$

After convergence of the distortion compensation process, because it is preferable that the complex number transmission signal equals the complex number feedback signal to be estimated, the real part $y_I(n)$ in Equation (8) above is set to be equal to the real part $x_I(n)$ of the transmission signal and the imaginary part $Y_Q(n)$ in Equation (9) above is set to be equal to the imaginary part $x_Q(n)$ of the transmission signal. For this purpose, from Equations (6) to (9) above, linear coefficients $\alpha_I$, $\alpha_Q$, $\beta_I$, and $\beta_Q$ are calculated as follows.

$$\alpha_I = \frac{1}{h_I}$$

$$\beta_I = -\alpha_I h_Q = -\frac{h_Q}{h_I}$$

$$\alpha_Q = -\frac{1}{h_Q}$$

$$\beta_Q = \alpha_Q h_I = -\frac{h_I}{h_Q}$$

Thus, after the linear coefficient calculating unit 240 calculates the coefficients $h_I$ and $h_Q$ from Equation (5) above, the linear coefficient calculating unit 240 calculates the linear coefficients $\alpha_I$, $\alpha_Q$, $\beta_I$, and $\beta_Q$ described above. Specifically, the linear coefficient calculating unit 240 calculates the complex number coefficient $h=h_I+jh_Q$ by using, for example, a least mean square (LMS) algorithm, as Equation (10) below.

$$h = h + \mu \times e_f(n) \times \{x(n)\}^* \qquad (10)$$

where, $e_f(n)=y(n)-\{h_I x_I(n)-h_Q x_Q(n)\}$

In Equation (10), p denotes a step size parameter, and * denotes a complex conjugate. Equation (10) is used to update the complex number coefficient h such that an error $e_f(n)$ between the real number FB signal $y(n)$ that is actually fed back from the power amplifier 160 and the real number FB signal $\{h_I x_I(n) - h_Q x_Q(n)\}$ that is approximated by the complex number transmission signal is reduced. Here, as the transmission signal, because modulation waves, such as OFDM (orthogonal frequency division multiplexing) represented by complex numbers in the baseband is generally used, the characteristic in which the cross-correlation between the real part $x_I(n)$ and the imaginary part $x_Q(n)$ of the transmission signal is low is used.

When the linear coefficient calculating unit 240 calculates the complex number coefficient h, the linear coefficient calculating unit 240 calculates the linear coefficients $\alpha_I$, $\alpha_Q$, $\beta_I$, and $\beta_Q$ described above from the coefficients $h_I$ and $h_Q$. These linear coefficients $\alpha_I$, $\alpha_Q$, $\beta_I$, and $\beta_Q$ are real numbers. Then, the linear coefficient calculating unit 240 outputs the linear coefficients $\alpha_I$, $\alpha_Q$, $\beta_I$, and $\beta_g$ to the cancel processing unit 250.

Then, the cancel processing unit 250 estimates a complex number feedback signal by performing linear computation that uses the linear coefficients $\alpha_1$, $\alpha_Q$, $\beta_I$, and $\beta_Q$. Specifically, a multiplier 11I multiplies the linear coefficient $\alpha_I$ by the real number FB signal $y(n)$. Furthermore, a multiplier 12I multiplies the linear coefficient $\beta_I$ by the imaginary part $x_Q(n)$ of the transmission signal. Then, a subtracter 13I performs subtraction represented by Equation (6) above and outputs the real part $y_I(n)$ of the complex number feedback signal. In contrast, a multiplier 11Q multiplies the linear coefficient $\alpha_Q$ by the real number FB signal $y(n)$. Furthermore, a multiplier 12Q multiplies the linear coefficient $\beta_Q$ by the real part $x_I(n)$ of the transmission signal. Then, a subtracter 13Q performs subtraction represented by Equation (7) and outputs the imaginary part $Y_Q(n)$ of the complex number feedback signal.

In this way, the linear coefficient calculating unit 240 calculates the real number linear coefficients from the transmission signal and the real number FB signal, and the cancel processing unit 250 estimates the complex number feedback signal by performing linear computation using the real number linear coefficients. Consequently, an amount of computation related to calculating the linear coefficients and estimating the feedback signals is sufficiently small when compared with a case in which model estimation and nonlinear computation are performed by using complex numbers. As a result, it is possible to reduce power consumption related to updating the distortion compensation coefficient.

Figure 3:
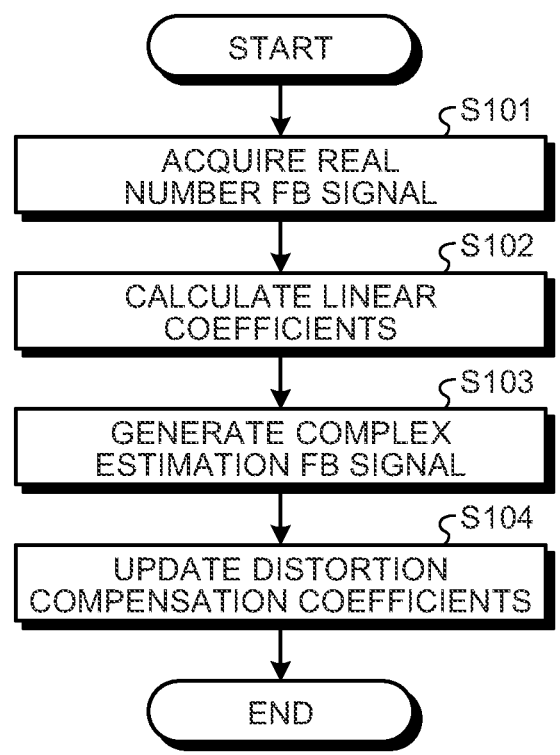
FIG. 3 is a flowchart illustrating a distortion compensation coefficient updating method according to the first embodiment.

In the following, a distortion compensation coefficient updating method used in the wireless communication apparatus 100 having the configuration described above will be described with reference to the flowchart illustrated in FIG. 3.

The transmission signal generated by the transmission signal generating unit 210 is subjected to distortion compensation by the distortion compensation unit 220, is subjected to DA conversion by the DACs 130I and 130Q, is subjected to quadrature modulation by the quadrature modulating unit 150, and then, is amplified by the power amplifier 160. Then, the transmission signal is transmitted via the antenna and is fed back and the feedback signal is subjected to down-conversion by the down converter 170, whereby a real number FB signal is obtained. The real number FB signal is subjected to AD conversion by the ADC 180 and is acquired by the linear coefficient calculating unit 240 and the cancel processing unit 250 (Step S101). Because the fed back signal is the real number FB signal, only the single ADC 180 is needed in the feedback path and it is thus possible to suppress an increase in power consumption in the analog part.

Then, the linear coefficients are calculated from the complex number transmission signal and the real number FB signal by the linear coefficient calculating unit 240 (Step S102). Specifically, in Equation (5) above, the coefficients $h_I$ and $h_Q$ are calculated from the known real number FB signal y(n), the real part $x_I(n)$ of the transmission signal, and the imaginary part $x_Q(n)$ of the transmission signal by using, for example, the LMS algorithm. Then, the real number linear coefficients $\alpha_I$, $\alpha_Q$, $\beta_I$, and $\beta_Q$ are calculated based on the relationship between the coefficients $h_I$ and $h_Q$ and the linear coefficients $\alpha_I$, $\alpha_Q$, $\beta_I$, and $\beta_Q$.

Figure 4A:
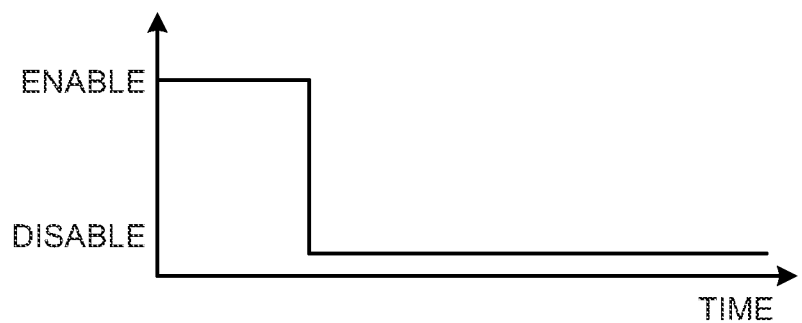
FIGS. 4A, 4B and 4C, are diagrams each illustrating calculation timing of linear coefficients.
Figure 4B:
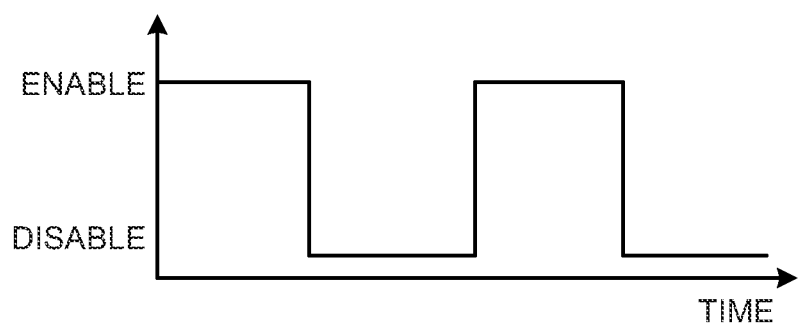
Figure 4C:
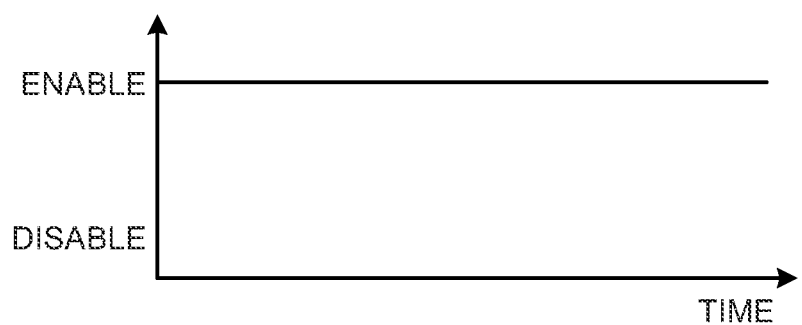

Here, because the linear coefficients $\alpha_I$, $\alpha_Q$, $\beta_I$, and $\beta_Q$ do not frequently vary, these linear coefficients may also be fixed after having been calculated at the time of activation of the wireless communication apparatus 100 or the like. Namely, for example, as illustrated in FIG. 4A, only a predetermined time period of the activation of the wireless communication apparatus 100, the linear coefficient calculating unit 240 may also be enabled and, during this period of time, the linear coefficients $\alpha_I$, $\alpha_Q$, $\beta_I$, and $\beta_Q$ may also be calculated. Furthermore, for example, because the linear coefficients $\alpha_I$, $\alpha_Q$, $\beta_I$, and $\beta_Q$ may also vary due to an environmental change, such as a temperature change, the linear coefficients $\alpha_I$, $\alpha_Q$, $\beta_I$, and $\beta_Q$ may also be periodically calculated. Namely, for example, as illustrated in FIG. 4B, the linear coefficient calculating unit 240 may also be periodically enabled after the activation of the wireless communication apparatus 100 and the linear coefficients $\alpha_I$, $\alpha_Q$, $\beta_I$, and $\beta_Q$ may also be calculated every time the linear coefficient calculating unit 240 is enabled. Furthermore, when an environmental change is large, for example, as illustrated in FIG. 4C, the linear coefficient calculating unit 240 may also be always enabled and the linear coefficients $\alpha_I$, $\alpha_Q$, $\beta_I$, and $\beta_Q$ may also be always updated.

The linear coefficients $\alpha_I$, $\alpha_Q$, $\beta_I$, and $\beta_Q$ calculated by the linear coefficient calculating unit 240 are output to the cancel processing unit 250. Then, the complex number feedback signal is estimated by linear computation performed by the cancel processing unit 250 using the linear coefficients $\alpha_I$, $\alpha_Q$, $\beta_I$, and $\beta_Q$ (Step S103). Specifically, the linear coefficient $\alpha_I$ is multiplied by the real number FB signal by the multiplier 11I, the linear coefficient $\beta_I$ is multiplied by the imaginary part of the transmission signal by the multiplier 12I, and an output of the multiplier 12I is subtracted from an output of the multiplier 11I by the subtracter 13I. Consequently, the real part of the feedback signal indicated by Equation (6) above is estimated.

Furthermore, the linear coefficient $\alpha_Q$ is multiplied by the real number FB signal by the multiplier 11Q, the linear coefficient $\beta_Q$ is multiplied by the real part of the transmission signal by the multiplier 12Q, and an output of the multiplier 12Q is subtracted from an output of the multiplier 11Q by the subtracter 13Q. Consequently, the imaginary part of the feedback signal indicated by Equation (7) above is estimated. In this way, when the complex number feedback signal is estimated from the real number FB signal, an amount of processing related to estimating feedback signals is relatively small because complicated computation on complex numbers or nonlinear computation is not performed. Thus, an amount of computation in the processor 110 is small and it is thus possible to reduce power consumption. The estimated real part and the estimated imaginary part of the feedback signal are output to the distortion compensation coefficient updating unit 230.

Then, because the predistortion signal and the feedback signal are used by the distortion compensation coefficient updating unit 230, the distortion compensation coefficients stored in the LUT included in the distortion compensation coefficient updating unit 230 are updated (Step S104). Specifically, based on the LUT included in the distortion compensation coefficient updating unit 230, the distortion compensation process is performed on the estimated complex number feedback signal, and then, the distortion compensation coefficients are updated by using, for example, the LMS algorithm such that an error between the predistortion signal and the estimated feedback signal that has been subjected to distortion compensation is small. Regarding the update of the distortion compensation coefficients, the complex number predistortion signal and the estimated complex number feedback signal are used. Thus, the distortion compensation coefficients are updated so as to reduce an error between the complex number signals and it is thus possible to accurately update the distortion compensation coefficients. The LUT updated by the distortion compensation coefficient updating unit 230 is periodically copied, and then, the LUT included in the distortion compensation unit 220 is updated by the copied LUT.

As described above, according to the embodiment, the real number FB signal is fed back from the power amplifier, the linear coefficients for estimating the complex number feedback signal are calculated from the complex number transmission signal and the real number FB signal, and the complex number feedback signal is estimated by linear computation performed by using the linear coefficients. Consequently, it is possible to estimate the complex number feedback signal without performing complicated computation and it is thus possible to update the distortion compensation coefficients from the complex number transmission signal and the complex number feedback signal. Namely, it is possible to reduce power consumption by decreasing an amount of computation related to updating the distortion compensation coefficients.

[b] Second Embodiment

In the first embodiment described above, the linear coefficients $\alpha_I$, $\alpha_Q$, $\beta_I$, and $\beta_Q$ are calculated assuming that both of the coefficients $h_I$ and $h_Q$ are the real numbers that are not zero, and then, the complex number feedback signal is estimated. However, one of the coefficients $h_I$ and $h_Q$ may possibly be zero depending on the real part $x_I(n)$ and the imaginary part $x_Q(n)$ of the transmission signal and the real number FB signal y(n) represented by Equation (5) above. Thus, the characteristic of a second embodiment is that, by adding a phase rotation to each of the transmission signal and the feedback signal, an update of the distortion compensation coefficients is possible even when one of the coefficients $h_I$ and $h_Q$ becomes zero.

Figure 5:
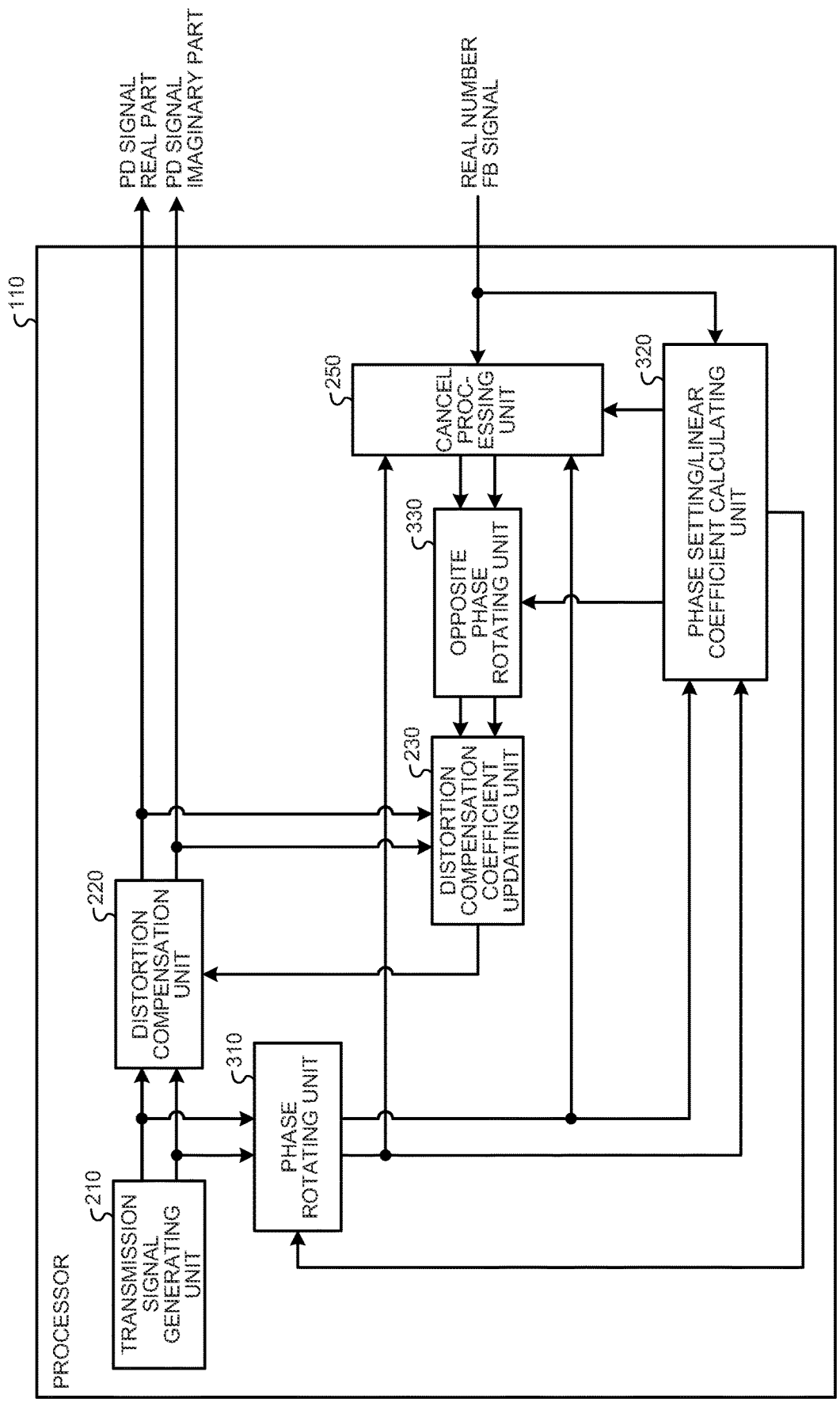
FIG. 5 is a block diagram illustrating a configuration of a processor according to a second embodiment.

A configuration of a wireless communication apparatus according to the second embodiment is the same as that of the wireless communication apparatus 100 (FIG. 1) according to the first embodiment; therefore, descriptions thereof will be omitted. FIG. 5 is a block diagram illustrating the configuration of the processor 110 according to the second embodiment. In FIG. 5, components that are the same as those illustrated in FIG. 2 are assigned the same reference numerals and descriptions thereof will be omitted. The processor 110 according to the second embodiment has a configuration in which, instead of the linear coefficient calculating unit 240 included in the processor 110 (FIG. 2) according to the first embodiment, a phase setting/linear coefficient calculating unit 320 is included and a phase rotating unit 310 and an opposite phase rotating unit 330 are added. Furthermore, in FIG. 5, a detailed configuration of the cancel processing unit 250 is not illustrated.

The phase rotating unit 310 adds the phase rotation having a phase rotation amount that is set by the phase setting/linear coefficient calculating unit 320 to the complex number transmission signal.

The phase setting/linear coefficient calculating unit 320 sets a phase difference between the transmission signal and the feedback signal that is estimated by the cancel processing unit 250 to a phase difference in which the phase of the real number FB signal corresponds to none of 0°, 90°, 180°, and 270°. For example, it is preferable that the phase setting/linear coefficient calculating unit 320 sets the phase difference between the transmission signal and the estimated feedback signal to either ±45° or ±135°. At this time, the phase setting/linear coefficient calculating unit 320 uses the real number FB signal, calculates a phase of the complex number coefficient $h=h_I+jh_Q$, and calculates a phase difference between the transmission signal and the feedback signal. Specifically, the phase setting/linear coefficient calculating unit 320 calculates a phase difference $\Delta\varphi$ between the transmission signal and the feedback signal by using Equation (11) below.

$$\Delta\varphi = \begin{cases} \tan^{-1}\frac{h_Q}{h_I} & (h_I \neq 0) \\ +90° & (h_I = 0 \text{ and } h_Q > 0) \\ -90° & (h_I = 0 \text{ and } h_Q < 0) \end{cases} \quad (11)$$

Then, the phase setting/linear coefficient calculating unit 320 determines a phase rotation amount that is to be set in the phase rotating unit 310 and the opposite phase rotating unit 330 based on the phase difference $\Delta\varphi$. For example, when the phase difference between the transmission signal and the feedback signal is set to +45°, the phase setting/linear coefficient calculating unit 320 determines that the phase rotation amount to be set in the phase rotating unit 310 is $\Delta\varphi$−45° and the phase rotation amount to be set in the opposite phase rotating unit 330 is −($\Delta\varphi$−45°. Then, the phase setting/linear coefficient calculating unit 320 sets the determined phase rotation amount to each of the phase rotating unit 310 and the opposite phase rotating unit 330.

Furthermore, the phase difference between the transmission signal and the feedback signal is not always set to be either ±45° or ±135°; however, by setting the phase difference to either ±45° or ±135°, it is possible to separate the phase of the real number FB signal from 0°, 90°, 180°, and 270°. Here, when the phase of the real number FB signal is one of 0°, 90°, 180°, and 270°, the coefficients $h_I$ and $h_Q$ become zero and the linear coefficients $\alpha_I$, $\alpha_Q$, $\beta_I$, and $\beta_Q$ described above are not able to be calculated. Consequently, the phase setting/linear coefficient calculating unit 320 sets the phase difference between the transmission signal and the feedback signal to either ±45° or ±135°, whereby it is possible to avoid the state in which the linear coefficients $\alpha_I$, $\alpha_Q$, $\beta_I$, and $\beta_Q$ are not able to be calculated.

Furthermore, similarly to the linear coefficient calculating unit 240 according to the first embodiment, based on the real part and the imaginary part of the transmission signal and based on the real number FB signal, the phase setting/linear coefficient calculating unit 320 calculates a linear coefficient for estimating a complex number feedback signal from the real number FB signal. Namely, the phase setting/linear coefficient calculating unit 320 calculates the linear coefficient for estimating the real part and the imaginary part of the complex number feedback signal by performing linear computation on three real numbers of the real number FB signal and the real part and the imaginary part of the transmission signal.

The opposite phase rotating unit 330 adds the phase rotation having phase rotation amount that is set by the phase setting/linear coefficient calculating unit 320 to the complex number feedback signal estimated by the cancel processing unit 250. The phase rotation that is added to the feedback unit 250 by the opposite phase rotating unit 330 has the same phase rotation amount as that of the phase rotation added to the transmission signal by the phase rotating unit 310 and takes an opposite direction.

Figure 6:
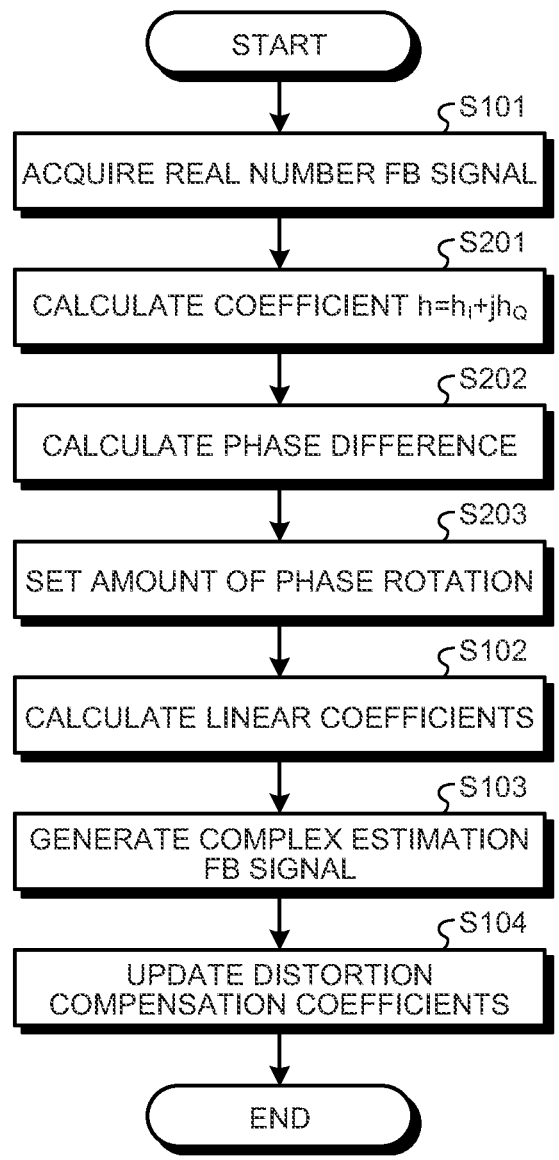
FIG. 6 is a flowchart illustrating a distortion compensation coefficient updating method according to the second embodiment.

Subsequently, the distortion compensation coefficient updating method used in the wireless communication apparatus 100 having the configuration described above will be described with reference to the flowchart illustrated in FIG. 6. Furthermore, in FIG. 6, parts that are the same as those illustrated in FIG. 3 are assigned the same reference numerals and descriptions thereof in detail will be omitted.

The transmission signal generated by the transmission signal generating unit 210 is subjected to distortion compensation by the distortion compensation unit 220, is subjected to DA conversion by the DACs 130I and 130Q, is subjected to quadrature modulation by the quadrature modulating unit 150, and then, is amplified by the power amplifier 160. Then, the transmission signal is transmitted via the antenna and fed back and the feedback signal is subjected to down-conversion by the down converter 170, whereby the real number FB signal is obtained. The real number FB signal is subjected to AD conversion by the ADC 180 and is acquired by the phase setting/linear coefficient calculating unit 320 and the cancel processing unit 250 (Step S101). Because the fed back signal is the real number FB signal, only the single ADC 180 is needed in the feedback path and it is thus possible to suppress an increase in power consumption in the analog part.

Then, the approximate expression indicated by Equation (5) above is used for the complex number transmission signal and the real number FB signal by the phase setting/linear coefficient calculating unit 320, whereby the complex number coefficient $h=h_I+jh_Q$ is calculated (Step S201). Furthermore, the phase difference $\Delta\varphi$ between the transmission signal and the feedback signal is calculated by the phase setting/linear coefficient calculating unit 320 using Equation (11) above (Step S202). Then, the phase rotation amount of each of the transmission signal and the feedback signal is calculated by the phase setting/linear coefficient calculating unit 320 such that the phase difference between the transmission signal and the feedback signal corresponds to, for example, either ±45° or ±135° and is set in the phase rotating unit 310 and the opposite phase rotating unit 330 (Step S203).

Specifically, when the phase difference between the transmission signal and the feedback signal is set to, for example, +45°, Δφ−45° is set in the phase rotating unit 310 as the phase rotation amount, and −(Δφ−45°) is set in the opposite phase rotating unit 330 as the phase rotation amount. When the phase rotation amount is set in the phase rotating unit 310, the phase rotation is added to the complex number transmission signal by the phase rotating unit 310, whereas, when the phase rotation amount is set in the opposite phase rotating unit 330, the phase rotation is added to the complex number feedback signal by the opposite phase rotating unit 330.

Furthermore, the linear coefficient is calculated, by the phase setting/linear coefficient calculating unit 320, from the complex number transmission signal in which the phase rotation is added and the real number FB signal (Step S102). The linear coefficient calculated by the phase setting/linear coefficient calculating unit 320 is output to the cancel processing unit 250. Then, the complex number feedback signal is estimated by linear computation performed by the cancel processing unit 250 using the linear coefficients (Step S103). In the linear computation performed here, complex number transmission signal in which the phase rotation is added and the real number FB signal are used.

Then, the distortion compensation coefficients stored in the LUT included in the distortion compensation coefficient updating unit 230 are updated by the distortion compensation coefficient updating unit 230 using the predistortion signal and the feedback signal to which the phase rotation is added (Step S104). The LUT updated by the distortion compensation coefficient updating unit 230 is periodically copied, and then, the LUT included in the distortion compensation unit 220 is updated by the copied LUT.

As described above, according to the embodiment, the phase rotation is added to both of the complex number transmission signal and the complex number feedback signal to be estimated by considering that the coefficients in the approximate expression that indicates the relationship between the complex number transmission signal and the real number FB signal become zero. Consequently, even when the coefficients in the approximate expression are zero, it is possible to update the distortion compensation coefficients by using the complex number transmission signal and the estimated complex number feedback signal.

[c] Third Embodiment

The characteristic of a third embodiment is that, the timings of the transmission signal and feedback signal are aligned by considering propagation delay in the feedback path of the real number FB signal.

Figure 7:
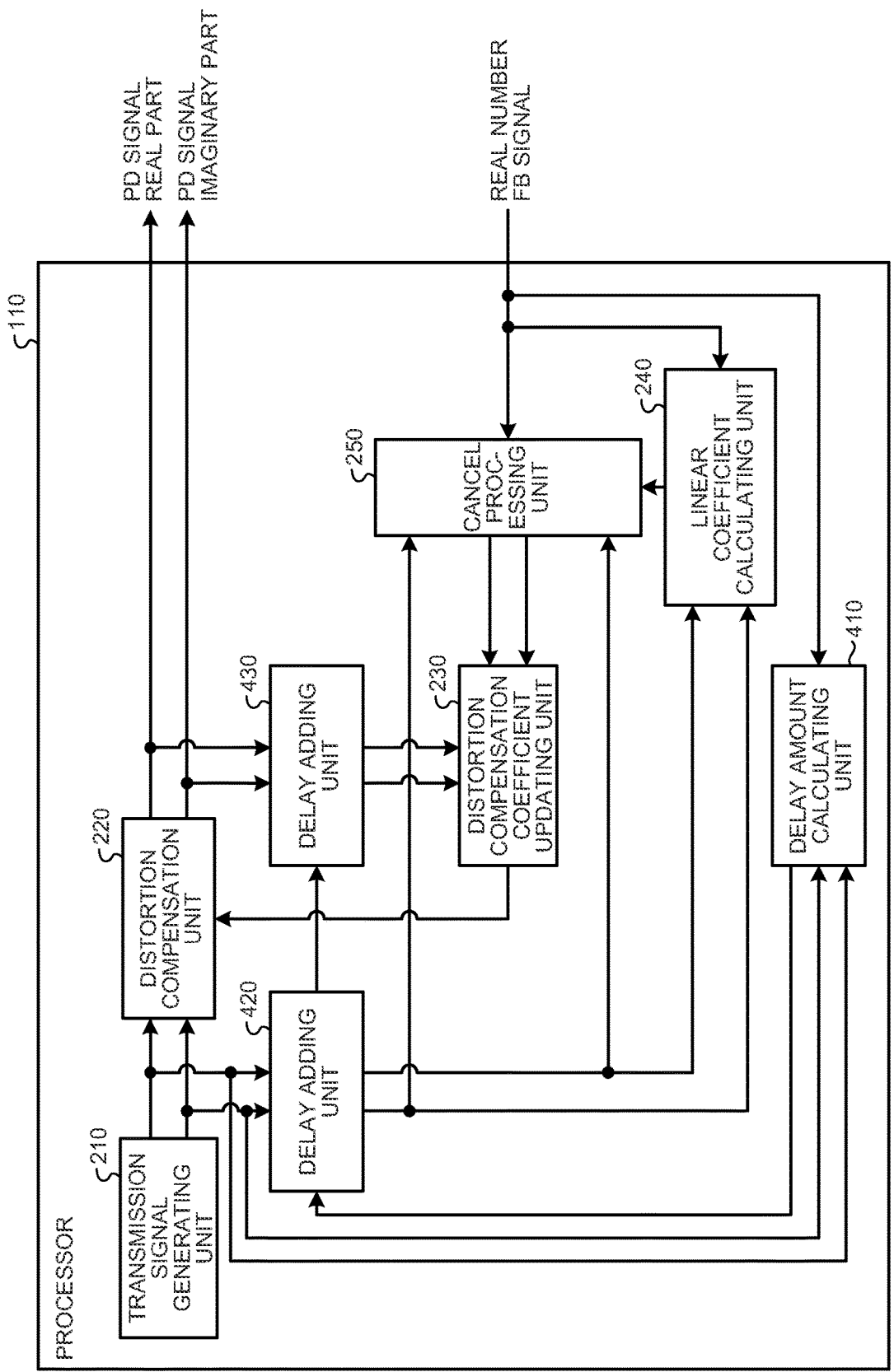
FIG. 7 is a block diagram illustrating a configuration of a processor according to a third embodiment.

A configuration of a wireless communication apparatus according to the third embodiment is the same as that of the wireless communication apparatus 100 (FIG. 1) according to the first embodiment; therefore, descriptions thereof will be omitted. FIG. 7 is a block diagram illustrating a configuration of the processor 110 according to the third embodiment. In FIG. 7, components that are the same as those illustrated in FIG. 2 are assigned the same reference numerals and descriptions thereof will be omitted. The processor 110 according to the third embodiment has a configuration in which, a delay amount calculating unit 410 and a delay adding units 420 and 430 are added to the processor 110 (FIG. 2) according to the first embodiment. Furthermore, in FIG. 7, a detailed configuration of the cancel processing unit 250 is not illustrated.

The delay amount calculating unit 410 calculates propagation delay T in the feedback path based on the complex number transmission signal and the real number FB signal. Specifically, the delay amount calculating unit 410 obtains an amount of delay in which a cross-correlation between, for example, the complex number transmission signal and the real number FB signal is the maximum. When the complex number transmission signal x(n) and the complex number feedback signal y(n) are represented by Equations (12) and (13) below, the cross-correlation of the transmission signal and the feedback signal are represented by Equation (14) below.

$$x(n) = \text{Re}[x(n)] + j\,\text{Im}[x(n)] = x_I(n) + jx_{Q(n)} \quad (12)$$

$$y(n) = \text{Re}[y(n)]j\,\text{Im}[y(n)] = y_I(n) + jy_Q(n) \quad (13)$$

$$\sum_n \{x(n+\tau)\}^* y(n) = \quad (14)$$

$$\sum_n \{\text{Re}[x(n+\tau)] - j\,\text{Im}[x(n+\tau)]\}\{\text{Re}[y(n)] + j\,\text{Im}[y(n)]\} =$$

$$\sum_n \{\text{Re}[x(n+\tau)]\text{Re}[y(n)] + \text{Im}[x(n+\tau)]\text{Im}[y(n)] +$$

$$j\,\text{Re}[x(n+\tau]\text{Im}[y(n)] - j\,\text{Im}[x(n+\tau)]\text{Re}[y(n)]\}$$

where, in Equations (12) to (14), Re[ ] indicates the real part of the complex number and Im[ ] indicates the imaginary part of the complex number. Here, because the real number FB signal is fed back, the delay amount calculating unit 410 sets Im[y(n)]=yQ(n)=0 in Equations (13) and (14), calculates the cross-correlation by using only the first term and the fourth term in Equation (14), and obtains the amount of delay τ in which the cross-correlation is the maximum.

The delay adding unit 420 adds the delay having the amount of delay τ calculated by the delay amount calculating unit 410 to the complex number transmission signal. Namely, the delay adding unit 420 aligns the timings of the transmission signal and the real number FB signal that are input to the linear coefficient calculating unit 240.

The delay adding unit 430 adds the delay having the amount of delay τ calculated by the delay amount calculating unit 410 to the complex number predistortion signal. Namely, the delay adding unit 430 aligns the timings of the predistortion signal and the estimated feedback signal that are input to the distortion compensation coefficient updating unit 230.

Figure 8:
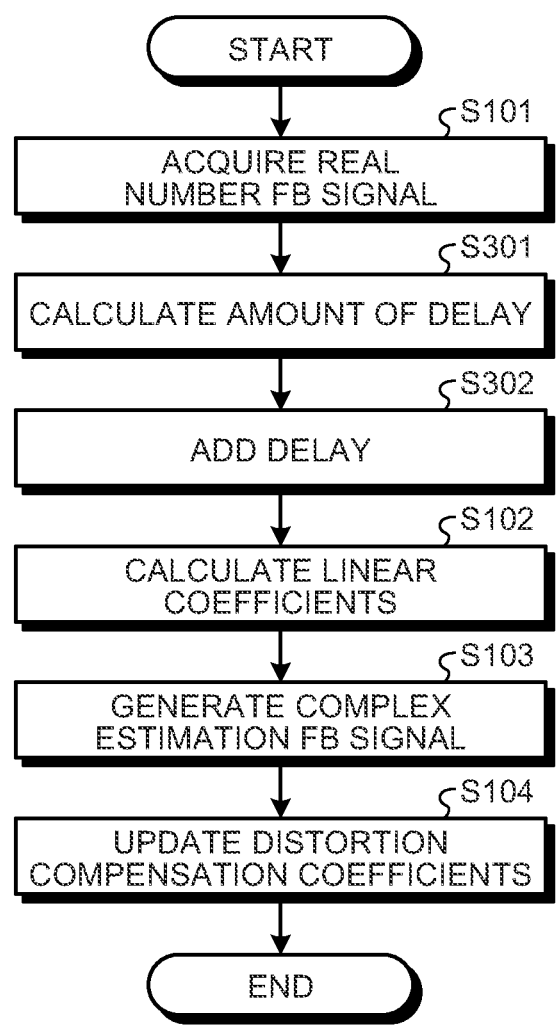
FIG. 8 is a flowchart illustrating a distortion compensation coefficient updating method according to the third embodiment.

Subsequently, the distortion compensation coefficient updating method used in the wireless communication apparatus 100 having the configuration described above will be described with reference to the flowchart illustrated in FIG. 8. Furthermore, in FIG. 8, parts that are the same as those illustrated in FIG. 3 are assigned the same reference numerals and descriptions thereof in detail will be omitted.

The transmission signal generated by the transmission signal generating unit 210 is subjected to distortion compensation by the distortion compensation unit 220, is subjected to DA conversion by the DACs 130I and 130Q, is subjected to quadrature modulation by the quadrature modulating unit 150, and then, is amplified by the power amplifier 160. Then, the transmission signal is transmitted via the antenna and fed back and the feedback signal is subjected to down-conversion by the down converter 170, whereby the real number FB signal is obtained. The real number FB signal is subjected to AD conversion by the ADC 180 and is acquired by the linear coefficient calculating unit 240, the cancel processing unit 250, and the delay amount calculating unit 410 (Step S101). Because the fed back signal is the real number FB signal, only the single ADC 180 is needed in the feedback path and it is thus possible to suppress an increase in power consumption in the analog part.

Figure 9:
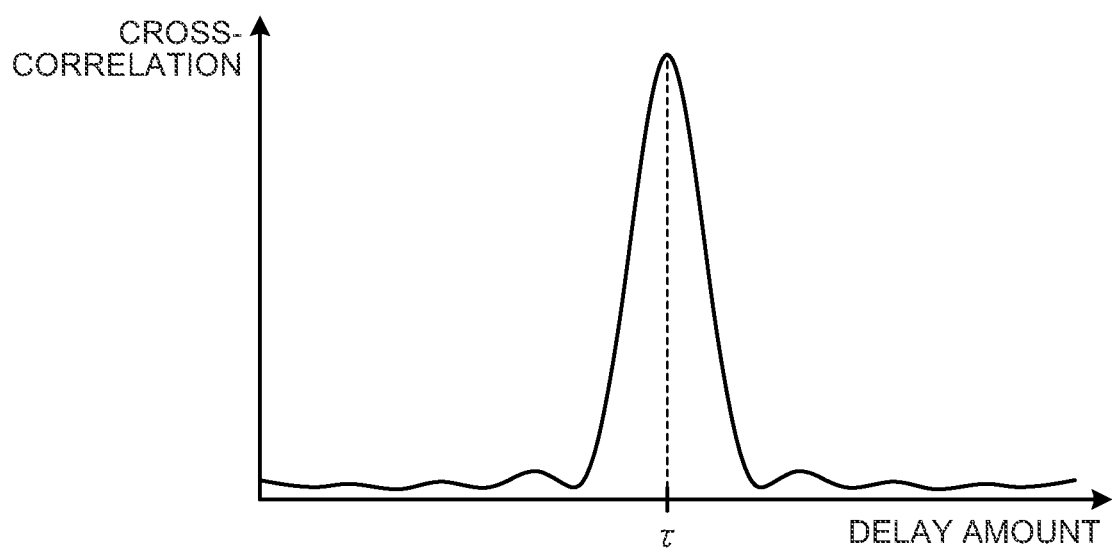
FIG. 9 is a diagram illustrating a specific example of the relationship between cross-correlation and an amount of delay.

Then, the cross-correlation between the complex number transmission signal and the real number FB signal is calculated by the delay amount calculating unit 410 and the amount of delay τ that allows the cross-correlation to be the maximum is calculated (Step S301). Namely, the cross-correlation between transmission signal and the real number FB signal is obtained while shifting, for example, the real number FB signal in the time direction with respect to the transmission signal, and the amount of delay τ in which the cross-correlation is the maximum is calculated, as illustrated in FIG. 9. Consequently, it is found that the real number FB signal is input to the linear coefficient calculating unit 240 and the cancel processing unit 250 by being delayed by the amount of delay τ after the transmission signal due to propagation delay in the feedback path.

Thus, after the delay having the amount of delay τ is added to the transmission signal by the delay adding unit 420 (Step S302), the transmission signal is input to the linear coefficient calculating unit 240. Furthermore, after the delay having the amount of delay τ is added to the predistortion signal by the delay adding unit 430 (Step S302), the predistortion signal is input to the distortion compensation coefficient updating unit 230.

Then, the linear coefficients are calculated, by the linear coefficient calculating unit 240, from the transmission signal in which the delay is added and the real number FB signal (Step S102). Consequently, it is possible to calculate accurate linear coefficients from the transmission signal and the real number FB signal whose timings are aligned. The linear coefficients calculated by the linear coefficient calculating unit 240 are output to the cancel processing unit 250. Then, the complex number feedback signal is estimated by linear computation using the linear coefficients by the cancel processing unit 250 (Step S103). Consequently, it is possible to accurately estimate the complex number feedback signal from the transmission signal and the real number FB signal whose timings are aligned.

Then, because the predistortion signal in which the delay is added and the feedback signal are used by the distortion compensation coefficient updating unit 230, the distortion compensation coefficients stored in the LUT included in the distortion compensation coefficient updating unit 230 are updated (Step S104). Consequently, it is possible to accurately update the distortion compensation coefficients from the predistortion signal and the feedback signal whose timings are aligned. The LUT updated by the distortion compensation coefficient updating unit 230 is periodically copied and the LUT stored in the distortion compensation unit 220 is updated by the copied LUT.

As described above, according to the embodiment, by obtaining an amount of delay corresponding to the propagation delay in the feedback path from the cross-correlation between the transmission signal and the real number FB signal and by allowing the transmission signal to be delayed by the obtained amount of delay, the timings of the transmission signal and the real number FB signal are aligned. Consequently, it is possible to update the distortion compensation coefficients from the transmission signal and the real number FB signal at the associated timing and it is thus possible to accurately update the distortion compensation coefficients.

Figure 10:
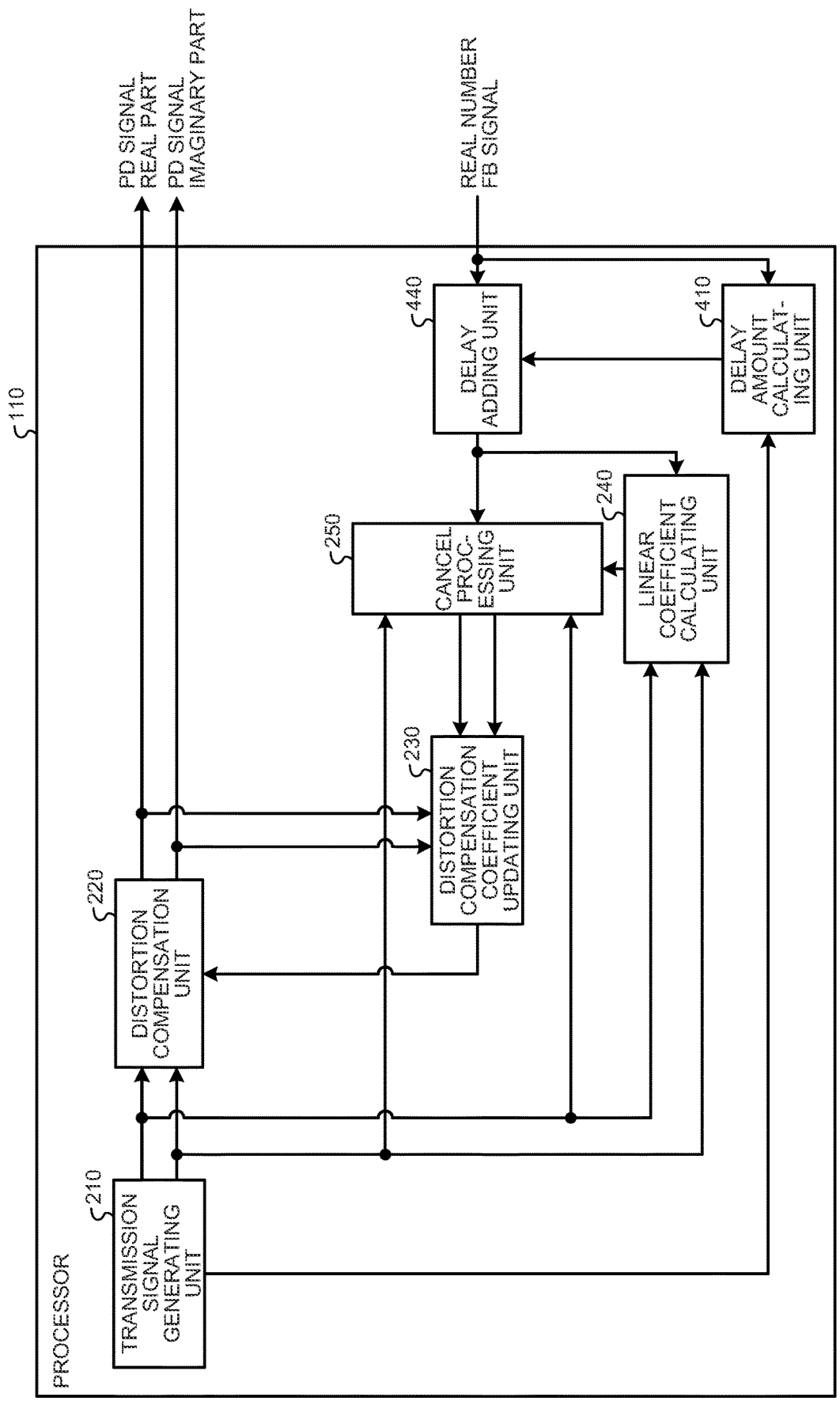
FIG. 10 is a block diagram illustrating a modification of the processor according to the third embodiment.

Furthermore, in the third embodiment described above, it is assumed that the delay adding units 420 and 430 adds the delay to the transmission signal and the predistortion signal; however, it may also be possible to align the timings of the transmission signal and the real number FB signal by adjusting the amount of delay of the real number FB signal. In this case, for example, as illustrated in FIG. 10, a delay adding unit 440 may be provided instead of the delay adding units 420 and 430 illustrated in FIG. 7.

The delay adding unit 440 controls the timings in which the real number FB signal is input to the linear coefficient calculating unit 240 and the cancel processing unit 250 and aligns the timings of the transmission signal and the real number FB signal. Namely, each of the linear coefficient calculating unit 240 and the cancel processing unit 250 includes a buffer (not illustrated) and performs a process, while temporarily accumulating samples of the transmission signal, of calculating the linear coefficients and estimating the complex number feedback signal by sequentially using the accumulated samples. Thus, the delay adding unit 440 inputs, to the linear coefficient calculating unit 240 and the cancel processing unit 250, the samples of the real number FB signal at the timing associated with the samples of the transmission signal that are used to calculate the linear coefficients and estimate the complex number feedback signal.

In this way, instead of inputting the transmission signal at previous timing to the linear coefficient calculating unit 240 and the cancel processing unit 250, by inputting the real number FB signal at the latest timing to the linear coefficient calculating unit 240 and the cancel processing unit 250, it may also be possible to align the timings of the transmission signal and the real number FB signal.

Furthermore, in each of the embodiments described above, it has been described of the distortion compensation coefficient updating method using an indirect learning technique in which the LUT included in the distortion compensation coefficient updating unit 230 is updated and the LUT is periodically copied and replaced by the LUT included in the distortion compensation unit 220. However, as in each of the embodiments described above, the process of estimating a complex number feedback signal from the complex number transmission signal and the real number FB signal and updating the distortion compensation coefficients is also applicable for the distortion compensation coefficient updating method using a direct learning technique in which the LUT included in the distortion compensation unit 220 is directly updated. Furthermore, in also a case in which a series-type distortion compensation is performed instead of an LUT-type distortion compensation, similarly to each of the embodiments described above, it is possible to estimate the complex number feedback signal from the complex number transmission signal and the real number FB signal and update the coefficients (distortion compensation coefficient) included in the series from the transmission signal and the estimated feedback signal.

According to an aspect of an embodiment of the wireless communication apparatus and the coefficient updating method disclosed in the present invention, an advantage is provided in that it is possible to reduce power consumption.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wireless communication apparatus comprising:
   a processor that performs distortion compensation on a complex number transmission signal by using a distortion compensation coefficient;
   a power amplifier that amplifies the transmission signal subjected to distortion compensation by the processor; and
   a feedback path that feeds back a signal output from the power amplifier to supply a real number feedback signal to the processor, wherein
   the processor executes a process comprising:
   estimating a complex number feedback signal by performing linear computation on the complex number transmission signal and the real number feedback signal; and
   updating the distortion compensation coefficient by using the estimated complex number feedback signal.

2. The wireless communication apparatus according to claim 1, wherein the estimating includes calculating a real part and an imaginary part of the complex number feedback signal by performing subtraction between a multiplication result obtained by multiplying a real number linear coefficient by a real part and an imaginary part of the complex number transmission signal and a multiplication result obtained by multiplying the real number linear coefficient by the real number feedback signal.

3. The wireless communication apparatus according to claim 1, wherein the process further comprises:
   calculating a linear coefficient used for the linear computation, based on an approximate expression indicating a relationship between the complex number transmission signal and the real number feedback signal.

4. The wireless communication apparatus according to claim 3, wherein the calculating includes calculating the linear coefficient by using a least mean square (LMS) algorithm.

5. The wireless communication apparatus according to claim 1, wherein the process further comprises:
   performing first phase rotation on the complex number transmission signal; and
   performing second phase rotation on the estimated complex number feedback signal in a direction opposite the first phase rotation, wherein
   the updating includes updating the distortion compensation coefficient by using the complex number feedback signal subjected to the second phase rotation.

6. The wireless communication apparatus according to claim 5, wherein the first and second phase rotation includes phase rotation on the complex number transmission signal and the complex number feedback signal such that a phase difference between the complex number transmission signal and the complex number feedback signal is one of +45° and +135°.

7. The wireless communication apparatus according to claim 1, wherein the process further comprises:
   adjusting, in accordance with propagation delay of the real number feedback signal in the feedback path, delay of one of the complex number transmission signal and the real number feedback signal.

8. The wireless communication apparatus according to claim 7, wherein the adjusting includes
   calculating an amount of delay in which a cross-correlation between the complex number transmission signal and the real number feedback signal is maximum, and
   adjusting the delay of the complex number transmission signal or the real number feedback signal by the calculated amount of delay.

9. A coefficient updating method comprising:
   amplifying, by a power amplifier, a complex number transmission signal subjected to distortion compensation by using a distortion compensation coefficient;
   feeding back, via a feedback path, a real number feedback signal corresponding to a signal output from the power amplifier;
   estimating, by performing linear computation on the complex number transmission signal and the real number feedback signal, a complex number feedback signal; and
   updating the distortion compensation coefficient by using the estimated complex number feedback signal.

* * * * *